United States Patent [19]

Somasiri et al.

[11] Patent Number: 4,975,327

[45] Date of Patent: Dec. 4, 1990

[54] POLYIMIDE SUBSTRATE HAVING A TEXTURED SURFACE AND METALLIZING SUCH A SUBSTRATE

[75] Inventors: Nanayakkara L. D. Somasiri; Thomas A. Speckhard, both of St. Paul, Minn.

[73] Assignee: Minnesota Mining and Manufacturing Company, St. Paul, Minn.

[21] Appl. No.: 378,369

[22] Filed: Jul. 11, 1989

[51] Int. Cl.[5] ................................................ B32B 9/00
[52] U.S. Cl. .................................. 428/409; 428/473.5; 428/901; 427/96; 427/250; 427/306; 427/310
[58] Field of Search ............ 428/209, 409, 457, 473.5, 428/901; 427/96, 250, 306, 310

[56] References Cited

U.S. PATENT DOCUMENTS

| | | | |
|---|---|---|---|
| 3,562,005 | 2/1971 | DeAngelo et al. | 430/314 |
| 4,720,401 | 1/1988 | Ho et al. | 427/250 |
| 4,725,504 | 2/1988 | Knudsen et al. | 428/473.5 |
| 4,806,395 | 2/1989 | Walsh | 427/307 |

FOREIGN PATENT DOCUMENTS 0187706  7/1986  European Pat. Off. .
0281312  9/1988  European Pat. Off. .

OTHER PUBLICATIONS

IBM Journal of R&D, RIE PI/CU Laminates, Ruoff et al., pp. 626–630, vol. 32(5), 9/1988.

*Primary Examiner*—Patrick Ryan
*Attorney, Agent, or Firm*—Donald M. Sell; Walter N. Kirn; Gregory A. Evearitt

[57] ABSTRACT

The adhesion of metal to a polyimide substrate is enhanced by depositing onto at least one surface of the polyimide a thin film of metal such as copper and heating in air to cause the deposited metal to texturize that surface by producing asperities that are at least 0.05 $\mu$m in average height and average breadth. In doing so, metal oxide clusters are formed at the textured surface. When the textured surface is metallized, the resulting composite resists delamination even at soldering temperatures.

16 Claims, 1 Drawing Sheet

POLYIMIDE SUBSTRATE HAVING A TEXTURED SURFACE AND METALLIZING SUCH A SUBSTRATE

BACKGROUND OF THE INVENTION

1. Field of the Invention

The invention is concerned with metallized polyimide substrates, and is specifically concerned with improving the adhesion between a polyimide substrate and metal (especially copper) layer for such purposes as permitting that metal layer to be soldered without danger of delamination.

2. Description of the Related Art

The insulated substrate of a printed circuit or a large-scale integrated circuit often is polyimide because of its stability at high temperatures, chemical resistance, and usefully low dielectric constant. A major concern is the adhesion of metal to the polyimide substrate, particularly at temperatures encountered in soldering operations. Efforts to improve adhesion primarily involve copper, because it is economical and almost always is the electrically conductive layer of a printed circuit or a large-scale integrated circuit.

A large number of patents and other publications concern the problem of improving the adhesion of metal to polyimide substrates. According to U.S. Pat. No. 4,152,195 (Baehrle et al.), earlier efforts to improve the adherence of a metal layer involved roughening of the surface of a polyimide substrate. Methods there mentioned include roughening by cathode sputtering, by chemical attack, and by generating electrical discharges in an oxygen atmosphere to partly burn the surface. The Baehrle method involved depositing a polyimide precursor onto a substrate, partially curing the precursor, vapor depositing a blanket layer of metal onto the partially cured precursor, and then fully curing the precursor.

Ruoff et al., "Improvement of Adhesion of Copper on Polyimide by Reactive Ion-beam Etching," *IBM J. Res. Devel.*, Vol. 32, No. 5, pp 626–630 (September 1988), says that adhesion of copper to polyimide is largely due to mechanical interlocking and that one way to improve copper/polyimide adhesion is simply to roughen one surface or the other. Shown are electron micrographs of polyimide film after oxygen reactive ion-beam etching to produce a grass-like surface structure.

In U.S. Pat. No. 3,562,005 (DeAnqelo et al.), a metallic pattern is applied to an insulating substrate. When the substrate is a polyimide film, "bond enhancement entails heating the substrate and metallic pattern in an atmosphere conducive to the formation of oxides of the metal of the pattern . . . Such heating has been found to induce the growth of a metal oxide on the metallic pattern at the pattern-polyimide interface. Oxide growth in this manner drives the oxide into the polyimide to increase the pattern-polyimide bond to about 15 lbs./linear inch. Such oxide growth may be due to the permeability of polyimides to the oxide formation-conducive atmosphere" (col. 10, lines 16–27).

In EPO Pat. Appln. No. 86300070.9 (Publ. No. 0,187,706, Ho et al.), adhesion between an organic substrate and metal is enhanced by heating the substrate and then depositing metal atoms onto the heated substrate until at least a few atomic layers of continuous metal are formed on the substrate. When the organic substrate is a polyimide and the metal is copper, good adhesion is attained at 250° C. because "the maximum amount of copper is found close to the surface of the polyimide", but at 300° C., "the copper merely diffuses into the depth of the polyimide, and its concentration within a few hundred angstroms of the interface is insufficient for achieving good adhesion" (p. 11).

U.S. Pat. No. 4,806,395 (Walsh) discusses a number of known methods for improving adhesion of metal to polyimide substrates. In one of these, an initial chromium layer is sputtered onto polyimide film which is then covered with a sputtered layer of copper. While this can afford excellent adhesion, sputtering is expensive, especially in a continuous process, and when the resulting laminate is used for printed circuitry, it can be difficult to etch away the chromium sublayer along with the copper layer.

After discussing the prior art, the Walsh patent says: "Prior to the present invention, there has been no commercially viable method available for the direct coating of polyimide films with electrically conductive layers, without the use of an adhesive, exhibiting adequate properties for general use in electronic circuitry" (col. 4, lines 23–27). In the Walsh patent, at least one surface of a polyimide film is treated with an alkaline solution to provide a textured and hydrophilic surface that "is characterized by nodules or bumps, rather than pits as reported for other texturizing methods" (col. 5, lines 12–14). The textured surface "can be contacted with colloidal palladium in order to provide a catalytic surface for the deposition of electroless nickel or cobalt" (col. 5, lines 33–35), followed by electrolytically deposited copper. The textured polyimide can also be useful as a substrate for the fabrication of adhesive-based metal-clad laminates.

The Walsh patent says: "Copper and palladium are not useful as initial metal layers since they can catalyze degradation of the polyimide and lead to poor post solder float peel strength values due to thermal sensitivity of the final laminate structure." (Col. 10, lines 340-34)

U.S. Pat. No. 4,725,504 (Knudsen et al.) has substantially the same teachings as the Walsh patent, as does EPO Pat. Appln. No. 88301570.3 (Publ. No. 281,312, Walsh).

U.S. Pat. No. 3,981,691 (Cuneo) concerns the use of a layer of chromium to improve the adhesion of a copper layer to a polyimide layer and teaches that better adhesion between the polyimide and copper layers is attained when the chromium layer contains a significant percentage of oxygen atoms.

In U.S. Pat. No. 4,710,403 (Krause et al.), adhesion of metal to a polymer such as polyimide is enhanced by contacting a surface of the polymer with a reducing solution to leave a negative charge at the surface and then contacting the surface with an oxidizing solution having reducible metal ions such as copper ions, thus forming on the surface either a film or particles of that metal. When a copper film is formed, its enhanced adhesion "to the polymer is due to a mechanical anchorage of the metal caused by immediate diffusion of the metal complex just within the polymer surface where reduction occurs. Metal builds on top on this diffused region forming the thick, conductive, copper film" (col. 7, lines 13–19).

U.S. Pat. No. 4,775,556 (Krause et al.) contains substantially the same disclosure as does U.S. Pat. No. 4,710,403.

SUMMARY OF THE INVENTION

The invention provides a convenient and economical method of modifying the surface of a polyimide substrate to enhance the adhesion of metal to the polyimide. The invention is believed to provide stronger adhesion directly between copper and a polyimide substrate than does any prior method, at least when tested after exposure to soldering temperatures. When the invention is used to adhere copper directly to a polyimide substrate, the resulting laminate is easy to etch; nevertheless, testing surprisingly indicates that there is less undercut in acid solutions than in prior copper/polyimide laminates.

Briefly, the method of the invention includes the sequential steps of:
(a) depositing onto at least one surface of a polyimide substrate a thin film of metal such as copper capable of catalyzing the texturization of polyimide,
(b) heating the polyimide substrate and deposited metal in air at a temperature of at least 350° C. and for a time sufficient to cause the metal to form metal oxide clusters at said surface and to texturize that surface by producing asperities that are at least 0.05μm in average height and average breadth, while allowing the polyimide substrate to retain good tensile strength and elongation.

By so texturizing the polyimide surface, adhesion to metal is significantly enhanced. The asperities of the textured surface typically are from 0.05 to 0.5μm in average height and from 0.05 to 0.5μm in average breadth. When greatly magnified, the textured surface has the appearance of a layer of popped corn.

By "thin film" in step (a) is meant a film of metal that is substantially continuous over a broad area while being virtually transparent, typically from 5 to 10 nm in thickness. The thin film of metal can be deposited in step (a) by any technique that produces that thickness. Useful thin films have been deposited in the practice of the invention by vapor deposition, by sputtering, by dip coating in a colloidal suspension, and by electroless deposition. The last of these is preferred, especially when performed as taught in the Krause U.S. Pat. No. 4,710,403, this being an economical method that is adapted to continuous manufacture and produces a uniform coating.

For optimum economy, the polyimide substrate and deposited metal are preferably are heated in step (b) to a temperature at which the desired texture is achieved within a few minutes. Higher temperatures allow shorter heating as do thinner deposits. Preliminary tests suggest that when air is blown across the surface during the heating step (b), the surface may achieve the designed texture within shorter heating times. The method by which the metal is deposited in step (a) may also change the time required at a given temperature. For example, metal deposited from colloidal suspension seems to provide faster texturizing. Also some metals produce the desired texture faster than others, e.g., palladium acts faster than does copper.

When copper has been deposited in step (a) to a thickness within the range of 5 to 10 nm, a desirable texture has usually been attained in step (b) within the following times:
at 400° C. within 20-40 minutes
at 430° C. within 5-15 minutes
at 450° C. within 2-7 minutes
at 470° C. within 1-3 minutes
at 500° C. within 20-40 seconds
at 540° C. within 7-14 seconds When heating at any temperature is continued for a time substantially longer than indicated above, there is danger of degrading the bulk polyimide substrate and thus significantly reducing its tensile strength and elongation. At times less than those indicated above, asperities formed in the surface tend to be less than 0.05μm in average height or breadth.

To produce a metallized substrate from the textured polyimide substrate, step (b) of the above-outlined method is followed by the sequential steps of
(c) depositing onto said textured surface an electrically-conductive metal sublayer, and
(d) electroplating an electrically conductive metal over the sublayer to produce a metallized polyimide substrate. Step (d) preferably is followed by drying, e.g. for 30-90 minutes at 100-150° C.

The thickness of the metal sublayer of step (c) preferably is at least 60 nm to enable a uniform layer to be built up by electroplating in step (d). Thicknesses much greater than 200 nm might be economically wasteful.

The electrically conductive metal sublayer of step (c) preferably is applied by sputtering or by electroless deposition. The latter is preferred, especially when performed as taught in the Krause Pat. No. 4,710,403 for the reasons explained hereinabove in connection with step (a). In the Krause patent, vanadium (II)EDTA$^{-2}$ is the preferred reducing agent. However, when sodium borohydride is used in step (c) of the novel method, the novel metallized polyimide substrate better resists delamination when exposed to 85° C., 85% RH.

While any electrically conductive metal can be used in each of steps (c) and (d), copper is preferred for both steps. It is economical, has good electrical conductivity, and users of printed circuits and large-scale integrated circuits are accustomed to copper. By using the same metal in both steps, etching is simplified.

The ultimate total thickness of the electrically conductive metal applied in steps (c) and (d) may be within the range of 1-40μm, usually at least 20μm for use in printed circuits. However, step d) may build the total thickness of electrically conductive metal to only about 1-5μm to provide a base suitable for semi-additive processing.

Polyimide substrates that have been texturized by steps (a) and (b) are useful for purposes other than to be metallized by steps (c) and (d). For example, the textured surfaces of the novel polyimide substrates provide enhanced adhesion to materials other than metals, e.g., to adhesives. To illustrate, a variety of pressure-sensitive adhesive tapes have been adhered by their adhesives to pieces of the novel polyimide substrates, and their resistance to 90° peel has been tested in comparison to the use of polyimide substrates that were identical except not being texturized. In every case, texturizing by steps (a) and (b) resulted in at least 20% improvement in resistance to 90° peel and sometimes as much as 100% improvement.

DETAILED DISCLOSURE

The following polyimides have been texturized by the method of the invention:
(1) poly(4,4'-oxydiphenylenepyromellitimide), which is the reaction product of pyromellitic dianhydride and 4,4'-diaminodiphenylether available as "Kapton" from E.I. duPont and also is made by Kanegafuchi Chemical Industries Co., Ltd., Japan and available as "Apical" from Allied-Signal Corp., Morristown, N.J.

(2) the reaction product of 3,3',4,4'-biphenyltetracarboxylic acid dianhydride and 4,4'-diaminodiphenylether available as "Upilex R" from Ube Chemical Industries, Japan;

(3) the reaction product of pyromellitic dianhydride and a combination of 4,4'-diaminodiphenylether and para-phenylene diamine, available as "Apical NPI"; and (4) the reaction product of pyromellitic dianhydride and a combination of 4,4'-diaminodiphenylether and 3,3'-dimethylbenzidine, available as "Novax" from Mitsubishi Chemical.

Texturizing proceeds more readily when using the polyimides of the above grouping (1). The use of higher temperatures and longer heating times tends to produce larger asperities.

Upon completing step (b), discrete metal oxide clusters tend to be partially or completely embedded in the polyimide substrate while being sufficiently close to its surfaces to be readily removed by being dissolved in an acid. There may be no need to do so, because the integrity of the metallized polyimide substrate resulting from steps (c) and (d) typically is approximately the same whether or not the oxide clusters have been removed. Removal of the oxide clusters does not appreciably change the magnified appearance of the textured surface prior to step (c).

When the electrically conductive metal sublayer of step (c) is applied by electroless deposition, doing so may reduce the oxide clusters at least in part to the metal, especially when the metal deposited in step (c) is the same as that of the oxide clusters.

THE DRAWINGS

The invention may be more easily understood in reference to the drawings, wherein.

Figure 1:
FIG. 1 is microtome section of a polyimide substrate of the invention.
Figure 2:
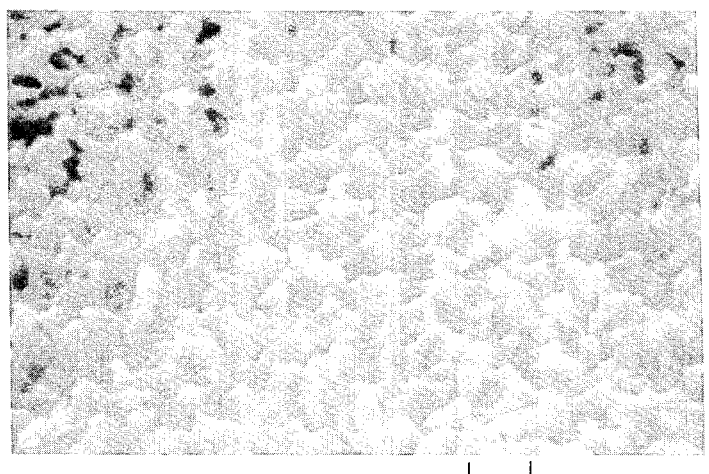
FIG. 2 is a photomicrograph of a polyimide substrate of the invention taken at 60° to its textured surface.

In order to make the microtome section shown in FIG. 1, a layer of epoxy resin was coated over the textured surface and cured. In the microtome section, the polyimide is at the bottom and the lighter colored epoxy is at the top. FIGS. 1 and 2 are discussed below in Examples 1 and 20, respectively.

TESTING

90° Peel Value

To test a metal/polyimide laminate, masking tape 1/16 inch (1.5mm) in width is applied to the metallized surface, and the metal is etched by immersion in aqueous 10M ferric chloride solution, repeatedly rinsed with de-aerated distilled water, and dried at 25° C., 50% RH for at least 4 hours. The 90° Peel Value of the remaining metal strip is measured with a tensile tester (Instron) by IPC (Institute of Printed Circuitry) Test Method 650-2.4.9, method A.

90° Peel Value after Heating to either 280° C. or 325° C.

Some specimens, after etching, are first dried for one hour at 125° C. and then inserted into a furnace, the temperature of which rises at about 15° C./min. from room temperature to the final test temperature of either 280° C. or 325° C. The specimens are immediately removed and allowed to cool to 20° C. and 40-60% RH, some being tested that day and others after storage at ordinary room temperature.

90° Peel Value after Thermal Shock

Some specimens after etching, are subjected to IPC Solder Float Test Method 650-2.4.9, Method C.

90° Peel Value after Acid Undercut

Some specimens, after etching, are immersed in a 50% (v/v) aqueous solution of concentrated hydrochloric acid at 70° C. for 20 minutes, rinsed with deionized water, and dried in air at 25° C., 50% RH for 24 hours followed by 125° C. for 1 hour and cooling to room temperature before testing for 90° Peel Values.

In the following examples, when both sides of the film were metallized, all 90° Peel Values were determined after the metal layer had been removed from one surface, as allowed by the IPC test method. When 90° Peel Values have been measured without removal of one layer, poor initial values have been obtained unless the current density at the beginning of step (d) has been relatively high, e.g., 330-400 Amps/m$^2$. Furthermore in order to obtain good 90° Peel Values after heating, it has been necessary to dry the polyimide substrate between steps c) and d), e.g., 20 minutes at 150° C. under N$_2$.

EXAMPLE 1

(Texturizing a Polyimide Substrate)

Onto each surface of a 5 cm × 8 cm × 75 μm piece of "Kapton" 300VN polyimide substrate, copper was deposited by the procedure of Example 20 of Krause U.S. Pat. No. 4,710,403 except as noted in the following step (a) which was carried out in a nitrogen atmosphere:

(a) the substrate was dipped for one minute into an aqueous reducing solution (25 mM, pH 11, tetramethyl ammonium vanadium ethylenediamine tetracetate); the resulting green colored film was rinsed with de-aerated deionized water and then dipped for 1.5 minutes into an oxidizing, aqueous copper ion solution (10 mM copper sulfate and 27 mM potassium oxalate); the deposited copper thin film (5-8 nm thick) was rinsed for 1-2 minutes with de-aerated deionized water and then dried in air for 15 minutes at 100° C.;

(b) the polyimide substrate was next placed in an electric furnace in air at 450° C. for 3 minutes, removed, and allowed to cool to room temperature.

This afforded to the polyimide substrate the textured surface shown in FIGS. 1 and 2 of the drawings. The maximum height of the asperities of the textured surface that are seen in FIG. 1 is about 0.5 μm and the maximum distance between adjacent asperities is about 0.5 μm. Most of the asperities are only about 0.05 μm in height and about 0.05 μm from adjacent asperities.

FIG. 1 also shows that copper deposited in step (a) had formed clusters seen as dark spots at the surface of the polyimide substrate. An electron diffraction pattern produced by those clusters suggests that the copper exists predominately in the form of cupric oxide. Fourier transform infrared and electron spectroscopic analysis of the textured surface showed it to be essentially the same as untreated polyimide. (

EXAMPLE 2

Preparation of a Metallized Polyimide Substrate)

(c) In a nitrogen atmosphere, the textured polyimide substrate of Example 1 was dipped for 45 seconds into an aqueous reducing solution (25 mM, pH 11, tetramethyl ammonium vanadium ethylenediamine tetracetate); rinsed with de-aerated deionized water for two minutes; and then dipped for one minute into an oxidizing, aqueous copper ion solution (10 mM copper sulfate and 27 mM potassium oxalate); the deposited copper (4 nm thick) was rinsed with de-aerated deionized water; the polyimide substrate was next immersed in a commercial electroless plating solution, i.e, "Cuposit" CP-78 from Shipley Chemical Co. Inc., Newton, MA, for 2 minutes to deposit 100 nm of electroless copper; rinsed with de-aerated deionized water and dried.

(d) onto the electroless copper layer of the polyimide substrate, a layer of copper approximately 25 μm thick was electroplated in a standard acid copper plating bath at a current density of about 175 Amps/m² for 75 minutes; followed by rinsing with de-aerated deionized water for 5 minutes; and drying in air for 24 hours at 25° C., 50% RH and for one hour at 125° C.

Tests of the resulting metallized polyimide substrate of Example 2 were:

|  | (N/dm) |
| --- | --- |
| Initial 90° Peel Value | 170 |
| 90° Peel Values after 280° C. | |
| Time (days) | |
| 0 | 120 |
| 1 | 100 |
| 9 | 90 |
| 90° Peel Values after 325° C. | |
| Time (days) | |
| 0 | 90 |
| 1 | 70 |
| 7 | 70 |
| 90° Peel Value, Thermal Shock | 160 |
| 90° Peel Value, Acid Undercut | 130 |

EXAMPLES 3-13

Metallized polyimide substrates were prepared as in Example 2 from a textured polyimide substrate made as in Example 1 except that in step (b), different temperatures and times were employed as indicated in Table I. Example 4 is a repeat of Example 2.

TABLE I

| | | | 90° Peel Values (N/dm) | |
| --- | --- | --- | --- | --- |
| Ex. | Temp. (°C.) | Time (Min.) | Initial | After 280° C. (No Delay) | After 280° C. (2 Day Delay) |
| 3 | 450 | 5.0 | 80 | 115 | 95 |
| 4 | 450 | 3.0 | 95 | 115 | 105 |
| 5 | 450 | 2.25 | 135 | 165 | 130 |
| 6 | 450 | 1.25 | 165 | 125 | 90 |
| 7 | 450 | 0.25 | 160 | 85 | 45 |
| 8 | 430 | 10.0 | 95 | 115 | 90 |
| 9 | 430 | 5.0 | 120 | 70 | 60 |
| 10 | 400 | 30.0 | 115 | 130 | 105 |
| 11 | 400 | 20.0 | 115 | 115 | 95 |
| 12 | 400 | 15.0 | 125 | 90 | 50 |
| 13 | 400 | 5.0 | 115 | 80 | 15 |

Microscopic examination of each of the polyimide substrates of Examples 3, 4, 5, 8, 10, and 11 after the heat-treatment step (b) showed substantially the same micro-topography as shown in FIG. 2 of the drawings. Those of examples 7, 12 and 13 had smaller asperities.

EXAMPLE 10-C (comparative)

A metallized polyimide substrate was prepared as in Example 10 except that in step (b), the heating was in a nitrogen atmosphere. This produced an initial 90° Peel Value of 25 N/dm, and 90° Peel Values after 280° C. of

| Aging Time (days) | (N/dm) |
| --- | --- |
| 0 | 10 |
| 1 | 15 |
| 3 | 0 |

EXAMPLES 14-19

Metallized polyimide substrates were prepared as in Example 2 from textured polyimide substrates made as in Example 1 except at different thicknesses of the thin film of copper deposited in step (a) as indicated in Table II, which also reports testing. Example 17 is a repeat of Example 2.

TABLE II

| | Reduct. Time | Cu Thick- | 90° Peel Values (N/dm) | | |
| --- | --- | --- | --- | --- | --- |
| Ex. | (Sec.) | (nm) | Initial | After 280° C. (No Delay) | After 280° C. (2 Day Delay) |
| 14 | 15 | 3 | 90 | 70 | 70 |
| 15 | 30 | 4 | 180 | 130 | 105 |
| 16 | 60 | 7 | 180 | 125 | 95 |
| 17 | 90 | 9 | 170 | 115 | 105 |
| 18 | 120 | 11 | 180 | 115 | 90 |
| 19 | 180 | 14 | 170 | 120 | 105 |

EXAMPLE 20

The heat-treated textured polyimide substrate of Example 1, at the conclusion of step (b), was immersed in a 50%(v/v) aqueous solution of concentrated nitric acid for 10 minutes and rinsed with de-aerated deionized water, thus dissolving the copper oxide clusters FIG. 2 shows the surface of the polyimide substrate after removal of the clusters. This magnified view of the surface was substantially unchanged as compared to a photomicrograph that had been made of the surface prior to removing the oxide clusters A microtome section showed no dark spots which are believed to indicate copper oxide clusters in FIG. 1 of the drawings.

The oxide-free polyimide substrate was then metallized as in Example 2 and tested, with the following results:

| | 90° Peel Values |
| --- | --- |
| Initial | 160 N/dm |
| After 280° C. thermal ramp: | 115 N/dm (0 days aging) |
| | 115 N/dm (2 days aging) |

EXAMPLE 21

Several pieces of "Kapton" 300V polyimide substrate were provided with copper thin films by the procedure described in Shipley product literature for the "Cuposit" CP-78 electroless copper system (Shipley Co. Inc., Newton Mass.). In doing so, a surface of the polyimide substrate was seeded with palladium and plated with electroless copper. To produce thin films of copper, plating times in the electroless copper solution were limited to 3-5 seconds. The samples were rinsed with deionized water and then heat-treated and metallized as described in Example 2. The heat-treatment was either 450° C. for 5 minutes or 400° C. for 30 minutes.

|  | 90° Peel Values |
| --- | --- |
| Initial | 90-180 N/dm |
| After 280° C. thermal ramp: | 50-100 N/dm (0 days aging) |
|  | 55-110 N/dm (1 day aging) |

When other identical samples were electrolessly copper plated for longer times, lower adhesion values were noted especially following the high-temperature thermal ramp. Samples plated for 20-45 seconds had the following 90° Peel Values:

|  | 90° Peel Values |
| --- | --- |
| Initial | 40-180 N/dm |
| After 280° C. thermal ramp: | 20-70 N/dm (0 days aging) |
|  | 0-60 N/dm (1 day aging) |

EXAMPLE 22

A piece of "Kapton" 300V polyimide substrate was subjected to step (a) of Example 1 except that the substrate was dipped for 15 seconds into the reducing solution and was oxidized in an aqueous 2.5 mM palladium chloride/ 50 mM potassium chloride solution for 30 seconds to deposit a thin film of palladium. Then the substrate was heat-treated at 400° C. for 2 minutes in air. Electron diffraction analysis of the residue indicated the presence of palladium and palladium oxide. This textured polyimide substrate was metallized as in Example 2 and tested:

|  | 90° Peel Values |
| --- | --- |
| Initial | 180 N/dm |
| After 280° C. thermal ramp: | 130 N/dm (0 days aging) |
|  | 110 N/dm (2 days aging) |
| After Acid Undercut: | 175 N/dm |

When another piece of the polyimide substrate was heat-treated at 400° C. for 5 minutes instead of 2 minutes, and when a third piece was heat-treated at 450° C. for 2 minutes, a greyish residue formed on the textured surface.

EXAMPLE 23

Pieces of "Kapton" polyimide substrate were textured as in Example 1 except that instead of step (a), the pieces were dip coated in a 2% (w/w) colloidal suspension of copper particles in mineral spirits (obtained from Mooney Chemical Co. Inc., Cleveland, Ohio) for 30 seconds. These pieces were not rinsed but immediately dried at 125° C. for 15 minutes. The samples were heated 450° C. for 2 minutes in air and then metallized as described in Example 2.

|  | 90° Peel Values |
| --- | --- |
| Initial | 130-180 N/dm |
| After 280° C. thermal ramp: | 70-165 N/dm (0 days aging) |
|  | 90-130 N/dm (5 days aging) |

EXAMPLES 24-28

Films of "Kapton" polyimide substrate were either sputtered or vapor coated [Step (a) of the above-outlined process] to form a 10-nm copper thin film and then heat-treated at 450° C. for 2-7 minutes. After heat-treatment, the textured substrate was copper coated using sputtering, vapor coating, or electroless plating processes [step (c)]. When by electroless plating process, the process of Example 21 was used except with a 2-minute immersion time. In each case, the resulting copper layer was thick enough to permit electrolytic deposition of 25 μm of copper to produce a metallized polyimide substrate, tests of which are reported in Table III. The "Controls" of Table III omitted steps (a) and (b).

TABLE III

|  |  |  | 90° Peel Values (N/dm) | |
| --- | --- | --- | --- | --- |
| Ex. | Step (a) | Step (c) | Initial | After 280° C. (1-Day Delay) |
| 24 | Sputter | Sputter | 105 | 60 |
| 25 | Sputter | Vapor Coat | 90 | 60 |
| 26 | Sputter | Plating | 125 | 95 |
| 27 | Vapor Coat | Sputter | 90 | 90 |
| 28 | Vapor Coat | Plating | 130 | 70 |
| CONTROLS | | | | |
| 24-C | None | Sputter | 35 | 15 |
| 25-C | None | Vapor Coat | 10 | 0 |
| 26-C | None | Plating | 0 | 0 |

EXAMPLE 29

A roll of "Kapton" 300V polyimide substrate (10 m long × 15 cm wide) was sputtered to form a 10-nm copper thin film. The coated substrate was then passed through an electrically heated convection oven (model CW5580F available from Blue M Company, Blue Island, Ill.) at 450° C., 3 minute residence time. The resulting textured substrate was sputtered with 100 nm of copper. Pieces cut from the roll were then electrolytically plated with copper to a final thickness of 25 μm, and the resulting laminates were tested. The remainder of the roll was electroplated with copper using a continuous electrolytic plating process to achieve the same total thickness. 90° Peel Values for continuously plated samples were comparable or slightly higher than those for the batch-plated samples. Average values were:

|  | 90° Peel Values |
| --- | --- |
| Initial | 145 N/dm |
| After 280° C. thermal ramp: | 90 N/dm (2 days aging) |
| After Acid Undercut: | 130 N/dm |

EXAMPLES 30-45

A roll of "Apical" 300 AV polyimide film was sputtered with copper to provide a 10 nm thin film as described in Example 29. Several different time-temperature profiles were used to texturize the PI film. The resulting textured polyimide substrates were subjected to tensile testing using ASTM method D0882-83. The results are shown in Table IV, the last entry of which shows testing of the original "Apical" polyimide film. From this data, it can be seen that the heat-treatment step (b) at preferred times and temperatures does not substantially change the tensile strength of a polyimide substrate, although there are modest reductions in elongation.

TABLE IV

| Ex. | Heat-treatment Step (b) | | Elongation (%) | | Tensile Strength (MPascals) | |
|---|---|---|---|---|---|---|
| | Temp. (°C.) | Time (Sec.) | Downweb | Crossweb | Downweb | Crossweb |
| 30 | 450 | 60 | 62 | 69 | 170 | 186 |
| 31 | 450 | 180 | 50 | 49 | 168 | 169 |
| 32 | 450 | 300 | 44 | 41 | 165 | 165 |
| 33 | 470 | 45 | 58 | 63 | 172 | 183 |
| 34 | 470 | 90 | 59 | 53 | 177 | 172 |
| 35 | 485 | 45 | 55 | 52 | 176 | 172 |
| 36 | 485 | 60 | 52 | 52 | 174 | 174 |
| 37 | 500 | 17 | 46 | 55 | 165 | 172 |
| 38 | 500 | 23 | 43 | 49 | 170 | 176 |
| 39 | 500 | 35 | 44 | 46 | 169 | 174 |
| 40 | 520 | 12 | 44 | 45 | 172 | 172 |
| 41 | 520 | 14 | 44 | 42 | 172 | 165 |
| 42 | 520 | 17 | 41 | 45 | 165 | 165 |
| 43 | 540 | 7 | 53 | 54 | 179 | 181 |
| 44 | 540 | 12 | 37 | 35 | 170 | 171 |
| 45 | 540 | 180 | 6 | 5 | 83 | 69 |
| | non-heat-treated | | 68 | 71 | 172 | 179 |

EXAMPLES 46-53

Polyimide film substrates were sputtered with copper as described in Example 29 except at various thicknesses of the deposited thin film of copper. Each was texturized at 450° C. for 3 minutes except that Examples 52 and 53 were texturized at 450° C. for 8 minutes. Each of the resulting textured polyimide substrates was metallized as in Example 2, and the resulting laminates were tested as reported in Table V.

TABLE V

| | | 90° Peel Values (N/dm) | |
|---|---|---|---|
| Ex. | Ave. Cu Thickness (nm) | Initial | After 280° C. (5-Days Delay) |
| 46 | 3 | 110 | 70 |
| 47 | 7 | 130 | 90 |
| 48 | 10 | 140 | 80 |
| 49 | 14 | 140 | 80 |
| 50 | 18 | 110 | 30 |
| 51 | 22 | 110 | 30 |
| 52 | 18 | 110 | 70 |
| 53 | 22 | 110 | 90 |

The data of Table V shows that a thicker thin film of metal requires longer heating of the polyimide substrate to afford a laminate with a metal layer that has a desired resistance to delamination after exposure to high temperature.

EXAMPLES 54-60

Table VI lists a number of polyimide film substrates that have been texturized after being sputtered as in Example 29 on both sides using two passes (one for each side of the web) through a vacuum sputtering apparatus. Each substrate was then texturized in a single pass through the heat-treating furnace (450° C., 3-minute dwell time). Each textured substrate was then metallized on both sides with a first-sputtered 100-nm copper layer and a second electrolytically plated 25 μm copper layer. Metallization of both textured surfaces required two passes (one for each side of the web) by the continuous processes described in Example 29. No side-to-side differences were observed.

TABLE VI

| | | 90° Peel Values (N/dm) | | | |
|---|---|---|---|---|---|
| Ex. | Film Polyimide | Initial | After 280° C. (0-Days Delay) | After 280° C. Adhesion (8-Days Delay) | After Acid Undercut |
| 54 | "APICAL" 100 AV | 90 | 80 | 70 | 95 |
| 55 | "APICAL" 300 AV | 125 | 95 | 80 | 100 |
| 56 | "Kapton" 300 HN | 125 | 105 | 80 | 115 |
| 57 | "Kapton" 500 HN | 130 | 105 | 85 | 115 |
| 58 | "Kapton" 300 V | 135 | 135 | 105 | 135 |
| 59 | "Kapton" 200 VN | 130 | 105 | 95 | 125 |
| 60 | "Kapton" 200 H | 135 | 115 | 105 | 130 |

EXAMPLE 61

To a roll of "Kapton" 300V polyimide substrate (10m long×15cm wide) was applied a thin film of copper as in step a) of Example 1 but in a continuous process line. The coated substrate was then passed through an electrically heated convection oven at 450° C., 3 minutes residence time. The resulting textured substrate was then plated with copper as described in step (c) of Example 2 but in a continuous process line. A piece (15cm long×13cm wide area) was cut from the roll and one surface was masked while the copper was etched off with nitric acid and then washed with deionized water.

After exposing the masked surface followed by two days drying in the air, copper was electroplated onto the remaining copper layer to a thickness of 12.5μm. After another day drying in air, a negative photoresist was laminated to the copper and exposed to UV radiation through a mask. After developing to remove the unexposed photoresist, the exposed copper was etched away, and then the remaining photoresist was stripped off. This left a sharp pattern of electrically conductive strips of copper having widths from 0.1 to 0.5mm.

| Examples 62–65 | |
|---|---|
| Example | Polyimide Substrate |
| 62 | "Kapton" 100 H |
| 63 | "Kapton" 100 V |
| 64 | "Kapton" 200 VN |
| 65 | "Apical" 300 AV |

A piece of each was textured as described in Example 1 and then etched for 10 minutes in 50% (v/v) aqueous solution of nitric acid to remove the copper oxide clusters. Each was then laminated to a copper foil by first coating onto the textured substrate a layer of thermosetting epoxy resin having a thickness of 13 μm and then curing the laminate in a heated platen press at 180° C. for 2 hours followed by a post cure heating cycle of 200° C. for 1 hour. The initial 90° Peel Value for each of these laminates was within the range of 140–160 N/dm.

For comparison, laminates were made in the same way except using untexturized polyimide substrates. Each such comparative laminate had an initial 90° Peel Value within the range of 50–70 N/dm.

What is claimed is:

1. A polyimide sheet or film having at least one textured surface characterized by asperities that are from 0.05 to 0.5μm in average height and from 0.05 to 0.5μm in average breadth.

2. A polyimide sheet or film as defined in claim 1 and having discrete metal oxide particles partially or completely embedded within the asperities and just beneath of the surfaces of the valleys between the asperities, while being sufficiently close to those surfaces to be readily removable by acid dissolution.

3. A composite of a polyimide sheet or film as defined in claim 1 and an electrically conductive layer of metal.

4. A composite as defined in claim 3 wherein said metal is copper.

5. A composite as defined in claim 3 wherein said layer of metal forms a pattern.

6. A composite wherein a layer of copper that does not exceed 40μm in thickness is in direct contact with a polyimide substrate, which laminate affords a 90° Peel Value (as herein defined) of at least 80 N/dm when measured one day after thermal ramp to 280° C.

7. Method of modifying at least one surface of a polyimide substrate to enhance the adhesion of a metal layer to that surface, said method comprising the sequential steps of:
 (a) depositing onto at least one surface of a polyimide substrate a thin film of metal capable of catalyzing the texturization of polyimide,
 (b) heating the polyimide substrate and deposited metal in air at a temperature of at least 350° C. and for a time sufficient to cause the metal to produce asperities that are at least 0.05μm in average height and breadth, while allowing the polyimide substrate to retain good tensile strength and elongation.

8. Method as defined in claim 7 wherein step (b) involves heating at a temperature of from 400° to 540° C.

9. Method as defined in claim 8 wherein step (b) involves heating at a temperature and for a time within the range from 400° C. for 20–40 minutes to 540° C. for 7–14 seconds and for intermediate times at intermediate temperatures.

10. Method as defined in claim 7 wherein the thin film is deposited in step (a) by a technique selected from vapor deposition, sputtering, dip coating in a colloidal suspension, and electroless deposition.

11. Method as defined in claim 7 wherein the metal deposited in step (a) is copper.

12. Method of metallizing a polyimide substrate, said method comprising the sequential steps of:
 (a) depositing onto at least one surface of a polyimide substrate a thin film of metal capable of catalyzing the texturization of polyimide;
 (b) heating the polyimide substrate and deposited metal in air at a temperature of at least 350° C. and for a time sufficient to cause the metal to produce asperities that are at least 0.05μm in average height and breadth while allowing the polyimide substrate to retain good tensile strength and elongation;
 (c) depositing onto said surface an electrically-conductive metal sublayer; and
 (d) electroplating an electrically conductive metal over the sublayer to produce a metallized polyimide substrate.

13. Method as defined in claim 12 wherein the sublayer is deposited in step (c) by a technique selected from sputtering and electroless deposition.

14. Method as defined in claim 12 wherein the metal deposited in each of steps (c) and (d) is copper.

15. Method as defined in claim 14 wherein the sublayer is built up in step (c) to a thickness of from 60 to 200 nm.

16. Method as defined in claim 15 wherein the metal is electroplated in step (d) until the total thickness of the electrically conductive metal applied in steps (c) and (d) is within the range of 1–40μm.

* * * * *